US009983712B2

(12) United States Patent
Chen

(10) Patent No.: US 9,983,712 B2
(45) Date of Patent: May 29, 2018

(54) TOUCH DISPLAY CIRCUIT, ITS DRIVING METHOD, TOUCH DISPLAY PANEL AND DISPLAY DEVICE

(71) Applicants: BOE Technology Group Co., Ltd., Beijing (CN); Beijing BOE Optoelectronics Technology Co., Ltd., Beijing (CN)

(72) Inventor: Xi Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days. days.

(21) Appl. No.: 15/122,239

(22) PCT Filed: Aug. 7, 2015

(86) PCT No.: PCT/CN2015/086326
§ 371 (c)(1),
(2) Date: Aug. 29, 2016

(87) PCT Pub. No.: WO2016/173141
PCT Pub. Date: Nov. 3, 2016

(65) Prior Publication Data
US 2017/0075460 A1 Mar. 16, 2017

(30) Foreign Application Priority Data
Apr. 27, 2015 (CN) .......................... 2015 1 0206419

(51) Int. Cl.
*G06F 3/041* (2006.01)
*G11C 11/02* (2006.01)
*G09G 5/00* (2006.01)

(52) U.S. Cl.
CPC .......... *G06F 3/0412* (2013.01); *G06F 3/0416* (2013.01); *G09G 5/003* (2013.01);
(Continued)

(58) Field of Classification Search
CPC ..... G06F 3/0412; G06F 3/0416; G09G 5/003; G09G 2300/0426; G09G 2310/08; G11C 11/02
See application file for complete search history.

(56) References Cited

U.S. PATENT DOCUMENTS

| | | |
|---|---|---|
| 9,342,202 B2 | 5/2016 | Keskin et al. |
| 2015/0346904 A1 | 12/2015 | Long et al. |
| 2016/0370928 A1 | 12/2016 | Hao et al. |

FOREIGN PATENT DOCUMENTS

| | | |
|---|---|---|
| CN | 201233589 Y | 5/2009 |
| CN | 102272706 A | 12/2011 |
| CN | 103761002 A | 4/2014 |
| CN | 103996370 A | 5/2014 |

(Continued)

OTHER PUBLICATIONS

International Search Report and Written Opinion, including English translation of Box No. V, for International Application No. PCT/CN2015/086326, dated Oct. 10, 2015, 12 pages.
(Continued)

*Primary Examiner* — Abhishek Sarma
(74) *Attorney, Agent, or Firm* — Westman, Champlin & Koehler, P.A.

(57) ABSTRACT

The present disclosure provides a touch display circuit, a driving method thereof, a touch display panel and a display device. During a touching stage, the touch triggering module is configured to supply a signal of the trigger signal terminal to the pulling-up node, the first outputting module is configured to supply a signal of the first clock signal terminal to the touch signal outputting terminal, the resetting module is configured to supply a signal of the first reference signal terminal to the pulling-up node and the second outputting module is configured to supply a signal of the second
(Continued)

reference signal terminal to the touch signal outputting terminal, so as to implement a touching function. During a displaying stage, the display switching module is configured to supply a signal of the common electrode signal terminal to the touch signal outputting terminal so as to implement a displaying function. The touch display circuit implements a time division output of the touch signal and the common electrode signal at the touch signal outputting terminal by cooperation of the respective module and implements a touch display circuit with a simple configuration so as to facilitate a design of the touch display panel with a narrow frame.

14 Claims, 5 Drawing Sheets

(52) U.S. Cl.
CPC ...... *G11C 11/02* (2013.01); *G09G 2300/0426* (2013.01); *G09G 2310/08* (2013.01)

(56) References Cited

FOREIGN PATENT DOCUMENTS

| CN | 104503652 A | 4/2015 |
| CN | 104765504 A | 7/2015 |

OTHER PUBLICATIONS

Extended European Search Report for European Patent Application No. 15890517.4, dated Jan. 15, 2018, 7 pages.

TOUCH DISPLAY CIRCUIT, ITS DRIVING METHOD, TOUCH DISPLAY PANEL AND DISPLAY DEVICE

CROSS-REFERENCE TO RELATED APPLICATION(S)

This application is a Section 371 National Stage Application of International Application No. PCT/CN2015/086326, filed on 7 Aug. 2015, and entitled "TOUCH DISPLAY CIRCUIT, ITS DRIVING METHOD, TOUCH DISPLAY PANEL AND DISPLAY DEVICE," and claims priority to Chinese Patent Application No. 201510206419.7, filed on Apr. 27, 2015, in the State Intellectual Property of China, the disclosures of which are incorporated herein by reference in their entirety.

TECHNICAL FIELD

The present disclosure relates to a touch field, and particularly to a touch display circuit, a driving method thereof, a touch display panel and a display device.

BACKGROUND

With rapid development of display technique, a touch screen panel has been widely applied in daily lives. At present, the touch screen may be divided according to their composition structures as follows: an add-on mode touch panel, an on-cell touch panel and an in-cell touch panel. The add-on mode touch panel is formed by separately producing a touch screen and a display screen and then jointing them together to constitute a display screen with a touch function. The in-cell touch panel embeds touch electrodes of the touch screen within the display screen, which may reduce the whole thickness of the modules and greatly decrease cost for manufacturing the touch screen, so it is favored by various venders of the panels. In the in-cell touch panel, a mutual-capacitance touch screen becomes a main stream of the current in-cell touch panel due to its higher sensitivity and an advantage of multi-points touching.

Particularly, the in-cell touch panel is a device in which touch scanning lines and touch sensing lines in the touch screen are integrated in the display screen. For example, the touch scanning lines and the touch sensing lines are integrated in a liquid crystal display (LCD) or an organic light emitting device (OLED). In a conventional design as shown in FIG. 1, a touch scanning signal on the touch scanning lines Txn (n=1, 2, 3, . . . ) is transferred through wires in a marginal frame by an external driver (IC). However, with increased size of the display screen, a quantity of the touch scanning lines Txn are increased and wires for transferring touch scanning signals to the touch scanning lines are correspondingly increased, which leads to spaces occupied by the wires are also increased and limits applications of the in-cell technique to a display screen with a large size and a narrow marginal frame.

In order to solve the issues as mentioned above, at present, a touch driving circuit for outputting a touch scanning signal to the touch scanning lines is usually integrated on an array substrate to omit wires in the marginal frames of the display so as to implement a display screen with a large size and a narrow marginal frame. Thus, it is urgent to provide a touch driving circuit integrated on the array substrate and having a simple configuration.

SUMMARY

Thus, embodiments of the present disclosure provide a touch display circuit, a driving method thereof, and a touch display screen so as to implement a touch display circuit integrated on an array substrate and having a simple configuration.

One embodiment of the present disclosure provides a touch display circuit comprising a touch triggering module, a display switching module, a resetting module, a first outputting module and a second outputting module, wherein an input terminal and a control terminal of the touch triggering module are connected to a trigger signal terminal, an output terminal of the touch triggering module is connected to a pulling-up node; the touch triggering module is configured to supply a signal of the trigger signal terminal to the pulling-up node under control of the trigger signal terminal; a control terminal of the display switching module is connected to a switch controlling terminal, an input terminal of the display switching module is connected to a common electrode signal terminal, and output terminal of the display switching module is connected to a touch signal outputting terminal; the display switching module is configured to supply a signal of the common electrode signal terminal to the touch signal outputting terminal under control of the switch controlling terminal; a control terminal of the resetting module is connected to a resetting signal terminal, an input terminal of the resetting module is connected to a first reference signal terminal, an output terminal of the resetting module is connected to the pulling-up node; the resetting module is configured to supply a signal of the first reference signal terminal to the pulling-up node under control of the resetting signal terminal; a control terminal of the first outputting module is connected to the pulling-up node, an input terminal of the first outputting module is connected to a first clock signal terminal, and an output terminal of the first outputting module is connected to the touch signal outputting terminal, the first outputting module is configured to supply a signal of the first clock signal terminal to the touch signal outputting terminal under control of the pulling-up node; a control terminal of the second outputting module is connected to a second clock signal terminal, an input terminal of the second outputting module is connected to a second reference signal terminal, and an output terminal of the second outputting module is connected to the touch signal outputting terminal; the second outputting module is configured to supply a signal of the second reference signal terminal to the touch signal outputting terminal under control of the second clock signal terminal; during a touch stage, a phase of the signal of the first clock signal terminal is opposite to that of the signal of the second clock signal terminal.

Alternatively, in the touch display circuit according to the embodiment of the present disclosure, the touch triggering module particularly comprises a first switch transistor in which a gate and a source of the first switch transistor are connected to the trigger signal terminal, and a drain of the first switch transistor is connected to the pulling-up node.

Alternatively, in the touch display circuit according to the embodiment of the present disclosure, the resetting module particularly comprises a second switch transistor in which a gate of the second switch transistor is connected to the resetting signal terminal, a source of the second switch transistor is connected to the first reference signal terminal, and a drain of the second switch transistor is connected to the pulling-up node.

Alternatively, in the touch display circuit according to the embodiment of the present disclosure, the display switching module particularly comprises a third switch transistor in which a gate of the third switch transistor is connected to the switch controlling terminal, a source of the third switch transistor is connected to the common electrode signal terminal, a drain of the third switch transistor is connected to the touch signal outputting signal terminal.

Alternatively, in the touch display circuit according to the embodiment of the present disclosure, the first outputting module particularly comprises a fourth switch transistor and a capacitor, in which a gate of the fourth switch transistor is connected to the pulling-up node, a source of the fourth switch transistor is connected to the first clock signal terminal, and a drain of the fourth switch transistor is connected to the touch signal outputting terminal; and the capacitor is connected between the gate and drain of the fourth switch transistor.

Alternatively, in the touch display circuit according to the embodiment of the present disclosure, the second outputting module particularly comprises a fifth switch transistor, in which a gate of the fifth switch transistor is connected to the second clock signal terminal, a source of the fifth switch transistor is connected to the second reference signal terminal, and a drain of the fifth switch transistor is connected to the touch signal outputting terminal.

Preferably, in the touch display circuit according to the embodiment of the present disclosure, during a displaying stage, the first clock signal terminal and the second clock signal terminal both output a common electrode signal; and the first reference signal terminal and the second reference signal both output a common electrode signal.

Preferably, in the touch display circuit according to the embodiment of the present disclosure, the switch transistors are all N-type transistors.

Correspondingly, an embodiment of the present disclosure further provides a touch display panel comprising a plurality of stages of cascaded touch display circuits according to the embodiments of the present disclosure as mentioned above, wherein except for the touch display circuit in the last stage, the touch signal outputting terminals of each of the remaining stages are connected to the trigger signal terminal of the touch display circuit in the subsequent adjacent stage; except for the touch display circuit in the first stage, the touch signal outputting terminals of each of the remaining stages are connected to the resetting signal terminal of the touch display circuit in the previous adjacent stage; and the trigger signal terminal of the touch displaying circuit in the first stage is connected to a frame start signal terminal.

Particularly, in the touch display panel according to the embodiment of the present disclosure, the first clock signal terminal of the touch display circuit in an odd stage and the second clock signal terminal of the touch display circuit in an even stage are connected to the same clock signal outputting terminal, and the second clock signal terminal of the touch display circuit in the odd stage and the first clock signal terminal of the touch display circuit in the even stage are connected to the same clock signal outputting terminal.

Correspondingly, an embodiment of the present disclosure further provides a display device comprising the touch display panel according to the embodiments of the present disclosure as mentioned above.

Correspondingly, an embodiment of the present disclosure further provides a driving method for the touch display circuit according to the embodiments of the present disclosure, which comprises the following steps: during a touching stage: in the first period, the touch triggering module is configured to supply a signal of the trigger signal terminal to the pulling-up node under control of the trigger signal terminal; in the second period, the first outputting module is configured to supply a signal of the first clock signal terminal to the touch signal outputting terminal under control of the pulling-up node; in the third period, the resetting module is configured to supply a signal of the first reference signal terminal to the pulling-up node under control of the resetting signal terminal and the second outputting module is configured to supply a signal of the second reference signal terminal to the touch signal outputting terminal under control of the second clock signal terminal; and during a displaying stage, the display switching module is configured to supply a signal of the common electrode signal terminal to the touch signal outputting terminal under control of the switch controlling terminal.

The present disclosure provides a touch display circuit, a driving method thereof, a touch display panel and a display device. The touch display circuit comprises a touch triggering module, a display switching module, a resetting module, a first outputting module and a second outputting module. During a touching stage, the touch triggering module is configured to supply a signal of the trigger signal terminal to the pulling-up node, the first outputting module is configured to supply a signal of the first clock signal terminal to the touch signal outputting terminal, the resetting module is configured to supply a signal of the first reference signal terminal to the pulling-up node and the second outputting module is configured to supply a signal of the second reference signal terminal to the touch signal outputting terminal, so as to implement a touching function. During a displaying stage, the display switching module is configured to supply a signal of the common electrode signal terminal to the touch signal outputting terminal so as to implement a displaying function. The touch display circuit implements a time division output of the touch signal and the common electrode signal at the touch signal outputting terminal by cooperation of the respective module and implements a touch display circuit with a simple configuration so as to facilitate a design of the touch display panel with a narrow frame. Furthermore, as compared with a touch circuit of the prior art which needs to separately provide a touch chip, the touch display circuit as mentioned above may integrate functions of touching and displaying into one body, so the touch chip and the display chip may be integrated into one chip to reduce product cost.

DETAILED DESCRIPTION

In the following, the touch display circuit, the driving method thereof, the touch display screen and the display device according to embodiments of the present disclosure will be illustrated in detail in conjunction with accompany figures.

Figure 1:
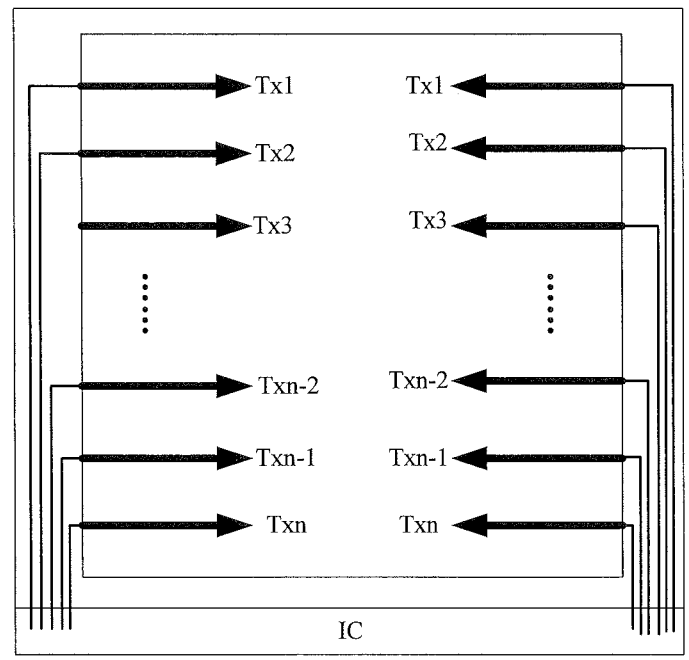
FIG. 1 is a schematic view of a structure of an in-cell touch panel of the prior art.
Figure 2:
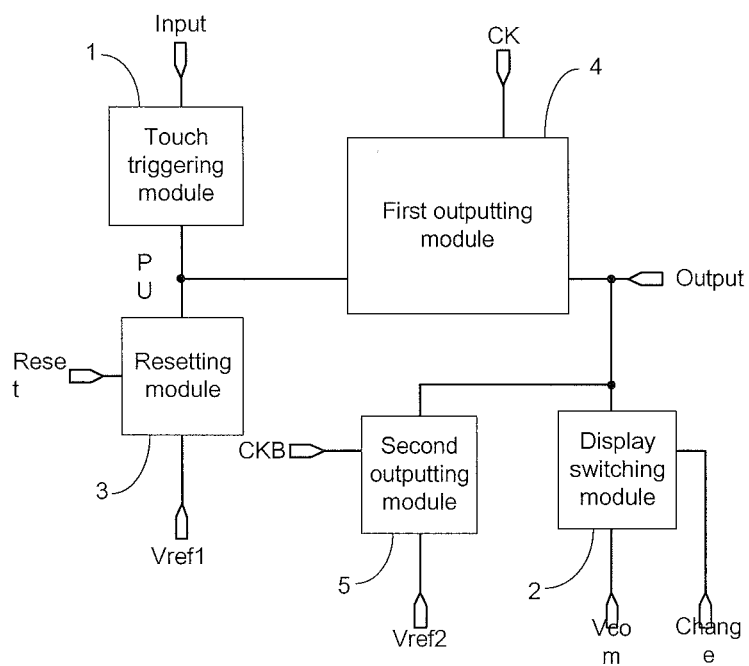
FIG. 2 is a schematic view of a structure of a touch display circuit according to an embodiment of the present disclosure.

As shown in FIG. 2, one embodiment of the present disclosure provides a touch display circuit comprising a touch triggering module 1, a display switching module 2, a resetting module, a first outputting module and a second outputting module, wherein an input terminal and a control terminal of the touch triggering module 1 are connected to a trigger signal terminal INPUT, an output terminal of the touch triggering module 1 is connected to a pulling-up node PU; the touch triggering module 1 is configured to supply a signal of the trigger signal terminal INPUT to the pulling-up node under control of the trigger signal terminal INPUT; a control terminal of the display switching module 2 is connected to a switch controlling terminal CHANGE, an input terminal of the display switching module 2 is connected to a common electrode signal terminal VCOM, and output terminal of the display switching module 2 is connected to a touch signal outputting terminal OUTPUT; the display switching module 2 is configured to, during a displaying state, supply a signal of the common electrode signal terminal VCOM to the touch signal outputting terminal OUTPUT under control of the switch controlling terminal CHANGE; an input terminal and a control terminal of the resetting module 3 is both connected to a resetting signal terminal RESET, and an output terminal of the resetting module 3 is connected to the pulling-up node PU; the resetting module 3 is configured to supply a signal of the first reference signal terminal VREF1 to the pulling-up node PU under control of the resetting signal terminal RESET; a control terminal of the first outputting module 4 is connected to the pulling-up node PU, an input terminal of the first outputting module 4 is connected to a first clock signal terminal CK, and an output terminal of the first outputting module 4 is connected to the touch signal outputting terminal OUTPUT; the first outputting module 4 is configured to supply a signal of the first clock signal terminal CK to the touch signal outputting terminal OUTPUT under control of the pulling-up node PU; a control terminal of the second outputting module 5 is connected to a second clock signal terminal CKB, an input terminal of the second outputting module 5 is connected to a second reference signal terminal VREF2, and an output terminal of the second outputting module 5 is connected to the touch signal outputting terminal OUTPUT; the second outputting module 5 is configured to supply a signal of the second reference signal terminal VREF2 to the touch signal outputting terminal OUTPUT under control of the second clock signal terminal CKB; during a touch stage, a phase of the signal of the first clock signal terminal CK is opposite to that of the signal of the second clock signal terminal CKB.

The present disclosure provides a touch display circuit, which comprises a touch triggering module, a display switching module, a resetting module, a first outputting module and a second outputting module. During a touching stage, the touch triggering module is configured to supply a signal of the trigger signal terminal to the pulling-up node, the first outputting module is configured to supply a signal of the first clock signal terminal to the touch signal outputting terminal, the resetting module is configured to supply a signal of the first reference signal terminal to the pulling-up node and the second outputting module is configured to supply a signal of the second reference signal terminal to the touch signal outputting terminal, so as to implement a touching function. During a displaying stage, the display switching module is configured to supply a signal of the common electrode signal terminal to the touch signal outputting terminal so as to implement a displaying function. The touch display circuit implements a time division output of the touch signal and the common electrode signal at the touch signal outputting terminal by cooperation of the respective module and implements a touch display circuit with a simple configuration so as to facilitate a design of the touch display panel with a narrow frame. Furthermore, as compared with a touch circuit of the prior art which needs to separately provide a touch chip, the touch display circuit as mentioned above may integrate functions of touching and displaying into one body, so the touch chip and the display chip may be integrated into one chip to reduce product cost.

It should be noted that in the touch display circuit according to the embodiment of the present disclosure, an effective pulse signal of the trigger signal terminal is a high level signal, and an effective pulse signal of the resetting signal terminal is also a high level signal. During the touching stage, the first clock signal terminal and the second clock signal terminal alternatively a low level signal since the trigger signal terminal outputs a high level signal, and the first reference signal terminal and the second reference signal terminal are at a low level at least during the touching stage.

Preferably, in order to avoid that during the displaying state, the first outputting module and the second outputting module disturb the touch signal outputting terminal, in the touch display circuit according to the embodiment of the present disclosure, during the displaying state, the first clock signal terminal and the second clock signal terminal both output the common electrode signal, and the first reference signal terminal and the second reference signal terminal both output the common electrode signal. Thus, during the displaying stage, the display switching module supplies a signal of the common electrode signal terminal to the touch signal outputting terminal under control of the switch controlling terminal; and the second outputting module supplies the common electrode signal at the reference signal terminal to the touch signal outputting terminal under control of the second clock signal terminal, meanwhile the first outputting modules supplies the common electrode signal at the first clock signal terminal to the touch signal outputting terminal under control of the pulling-up node.

The present invention will be illustrated in detail in conjunction with particular embodiments. It should be noted that the embodiments is utilized not to limit the present invention, but to better explain the present invention.

Figure 3A:
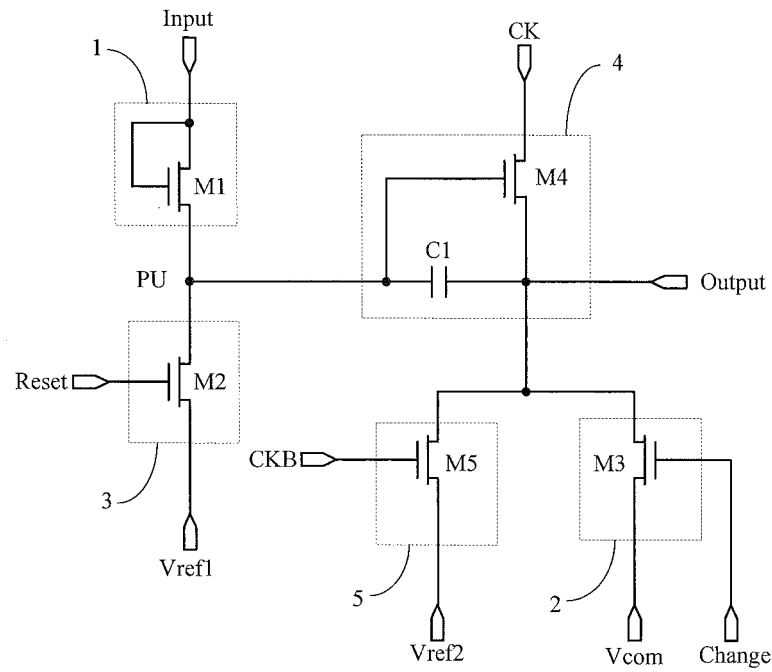
FIG. 3a and FIG. 3b are schematic view of particular structures of the touch display circuit according to an embodiment of the present disclosure, respectively.
Figure 3B:
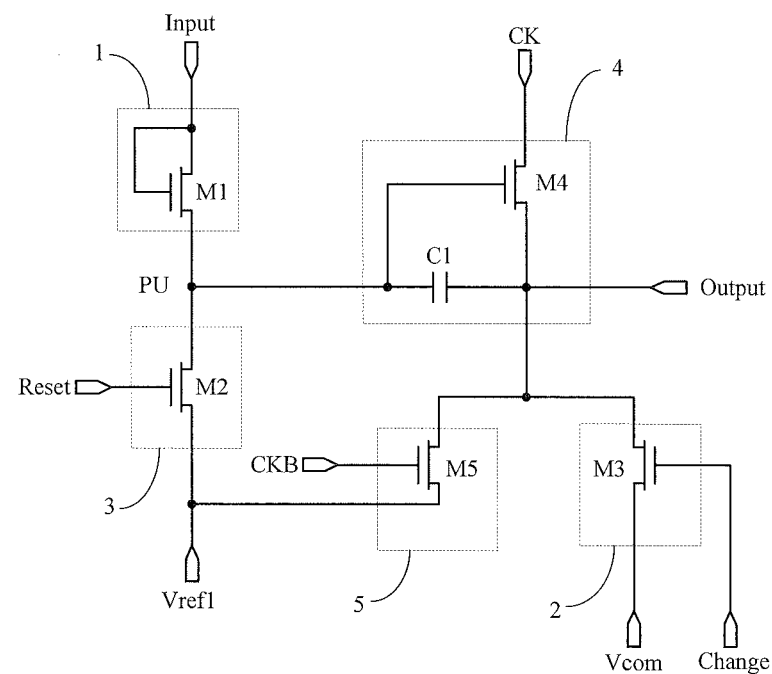

Preferably, in the touch display circuit according to the embodiment of the present disclosure, as shown in FIG. 3a and FIG. 3b, the touch triggering module particularly comprises a first switch transistor M1 in which a gate and a source of the first switch transistor M1 are connected to the trigger signal terminal INPUT, and a drain of the first switch transistor M1 is connected to the pulling-up node PU.

Particularly, in the touch display circuit according to the embodiment of the present disclosure, when the first switch transistor is turned on under control of the trigger signal terminal, the signal of the trigger signal terminal is supplied to the pulling-up node to raise an electrical potential at the pulling-up node.

The above description is taken as an example for illustrating the particular structure of the touch triggering module in the touch display circuit. In a particular implementation, the particular structure of the touch triggering module is not limited to the above structure provided by the embodiment of the present disclosure and may be other structures known by those skilled in the art. There is not any limitation on the particular structure.

Preferably, in the touch display circuit according to the embodiment of the present disclosure, as shown in FIG. 3a and FIG. 3b, the resetting module 3 particularly comprises a second switch transistor M2 in which a gate of the second switch transistor M2 is connected to the resetting signal terminal RESET, a source of the second switch transistor M2 is connected to the first reference signal terminal VREF1, and a drain of the second switch transistor M2 is connected to the pulling-up node PU.

Particularly, in the touch display circuit according to the embodiment of the present disclosure, when the second switch transistor is turned on under control of the resetting signal terminal, the signal of the first reference signal terminal is supplied to the pulling-up node to decrease the electrical potential at the pulling-up node.

The above description is taken as an example for illustrating the particular structure of the resetting module in the touch display circuit. In a particular implementation, the particular structure of the resetting module is not limited to the above structure provided by the embodiment of the present disclosure and may be other structures known by those skilled in the art. There is not any limitation on the particular structure.

Preferably, in the touch display circuit according to the embodiment of the present disclosure, as shown in FIG. 3a and FIG. 3b, the display switching module 2 particularly comprises a third switch transistor M3 in which a gate of the third switch transistor M3 is connected to the switch controlling terminal CHANGE, a source of the third switch transistor M3 is connected to the common electrode signal terminal VCOM, a drain of the third switch transistor M3 is connected to the touch signal outputting signal terminal OUTPUT.

Particularly, in the touch display circuit according to the embodiment of the present disclosure, during the displaying stage, when the third switch transistor is turned on under control of the switch controlling terminal, the signal of the common electrode signal terminal is supplied to the touch signal outputting terminal to implement the displaying function.

The above description is taken as an example for illustrating the particular structure of the display switching module in the touch display circuit. In a particular implementation, the particular structure of the display switching module is not limited to the above structure provided by the embodiment of the present disclosure and may be other structures known by those skilled in the art. There is not any limitation on the particular structure.

Preferably, in the touch display circuit according to the embodiment of the present disclosure, as shown FIG. 3a and FIG. 3b, the first outputting module 4 particularly comprises a fourth switch transistor M4 and a capacitor C1, in which a gate of the fourth switch transistor M4 is connected to the pulling-up node PU, a source of the fourth switch transistor M4 is connected to the first clock signal terminal CK, and a drain of the fourth switch transistor M4 is connected to the touch signal outputting terminal OUTPUT; and the capacitor C1 is connected between the gate and drain of the fourth switch transistor T4.

Particularly, in the touch display circuit according to the embodiment of the present disclosure, when the touch triggering module pulls up an electrical potential at the pulling-up node, the fourth switch transistor is turned on; meanwhile, since an electrical potential of the signal at the first clock signal terminal is at a low level, the touch signal outputting signal outputting terminal outputs a low level signal; when the signal at the first clock signal terminal becomes a high level from the low level, the electrical potential at the pulling-up node is further pulled up due to a bootstrap function of the capacitance, and the turned-on fourth switch transistor supplies the signal of the first clock signal terminal having a high level to the touch signal outputting terminal to implement the touching function.

The above description is taken as an example for illustrating the particular structure of the first outputting module in the touch display circuit. In a particular implementation, the particular structure of the first outputting module is not limited to the above structure provided by the embodiment of the present disclosure and may be other structures known by those skilled in the art. There is not any limitation on the particular structure.

Preferably, in the touch display circuit according to the embodiment of the present disclosure, as shown in FIG. 3a and FIG. 3b, the second outputting module 5 particularly comprises a fifth switch transistor M5, in which a gate of the fifth switch transistor M5 is connected to the second clock signal terminal CKB, a source of the fifth switch transistor M5 is connected to the second reference signal terminal VREF2, and a drain of the fifth switch transistor M5 is connected to the touch signal outputting terminal OUTPUT.

Particularly, in the touch display circuit according to the embodiment of the present disclosure, when the resetting module pulls down the electrical potential at the pulling-up node, the fifth switch transistor is turned on under control of the second clock signal terminal so as to supply a signal at the second reference signal terminal and having a low level to the touch signal outputting terminal to implement the touching function.

The above description is taken as an example for illustrating the particular structure of the second outputting module in the touch display circuit. In a particular implementation, the particular structure of the second outputting module is not limited to the above structure provided by the embodiment of the present disclosure and may be other structures known by those skilled in the art. There is not any limitation on the particular structure.

Furthermore, in the touch display circuit according to the embodiment of the present disclosure, as shown in FIG. 3b, the first reference signal terminal VREF1 and the second reference signal VREF2 may be connected to the same signal terminal. That is to say, the first reference signal terminal VREF1 is the second reference signal terminal VREF2.

It should be noted that in the embodiment of the present disclosure as mentioned above, the switch transistors may be N-type transistors (TFT: Thin Film Transistor). In a particular implementation, the source and drain of these transistors may be interchanged with each other, and there is not any particular limitation. In a particular implementation, the N-type transistor may be turned on if the electrical potential at its gate is at a high level, and is turned off if the electrical potential at its gate is at a low level.

Preferably, in order to simplify the manufacturing process, in the touch display circuit according to the embodiment of the present disclosure, all of the switch transistors are N-type transistors. Thus, the embodiment of the present disclosure provides a design of N-type transistor integrated with a touch display circuit. As compared with the touch display circuit constituted of N-type transistors and P-type transistors in the prior art, the touch display circuit according to the embodiment of the present disclosure may be developed reliably, has a simple structure and fewer number of the switch transistors. Such a design may save spaces and facilitate a narrow marginal frame of the product.

Figure 4:
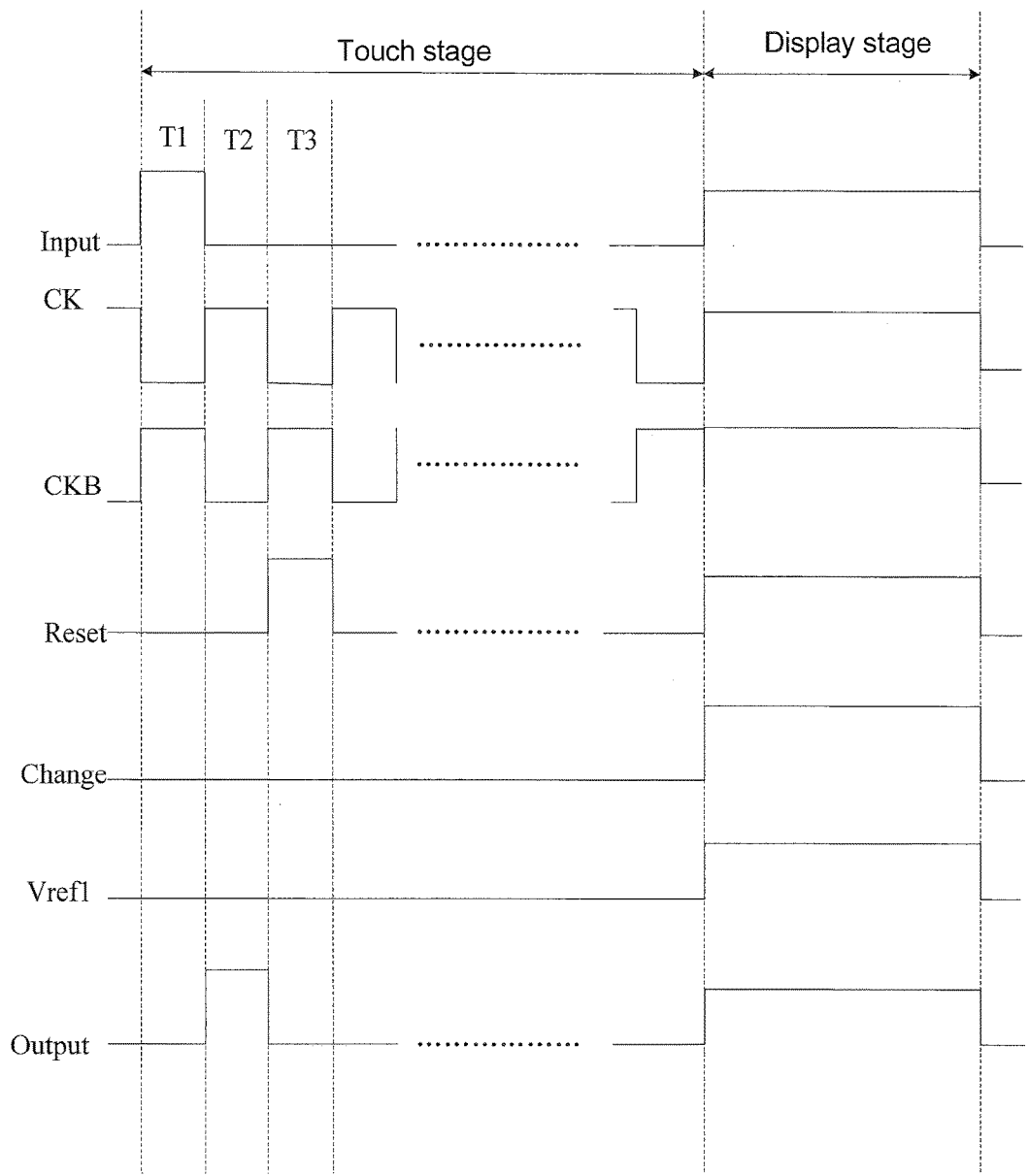
FIG. 4 is a time sequence chart of the touch display circuit as shown in FIG. 3b.

In the following, an operation flow of the touch display circuit according to the embodiment of the present disclosure will be illustrated in detail by taking the touch display circuit as shown in FIG. 3b as an example. In the touch display circuit as shown in FIG. 3b, effective pulse signals of the trigger signal terminal INPUT and the resetting signal terminal RESET are high level signals, all of the switch transistors are N-type transistors, and the corresponding input and output time sequences are shown in FIG. 4. In the following, a reference sign of "1" represents a signal at the high level and a reference sign of "0" represents a signal at the low level.

During T1 stage of the touching stage, INPUT=1, RESET=0, CK=0, CKB=1, CHANGE=0 and VREF1=0. The second switch transistor M2 and the third switch transistor M3 are turned off. Since INPUT=1, the first switch transistor M1 is turned on to pull up the electrical potential at the pulling-up node PU; the fourth switch transistor M4 is turned on and the turned on fourth switch transistor M4 supplies the signal at the first clock signal terminal CK to the touch signal outputting terminal OUTPUT. Meanwhile, since CKB=1, the fifth switch transistor M5 is turned on and the turned-on fifth switch transistor M5 supplies the signal at the first reference signal terminal VREF1 to the touch signal outputting terminal OUTPUT so that the touching signal outputting terminal OUTPUT outputs a signal of a low level.

During T2 stage of the touching stage, INPUT=0, RESET=0, CK=1, CKB=0, CHANGE=0 and VREF1=0. The first switch transistor M1, the second switch transistor M2 and the third switch transistor M3 are turned off. Since CK=1, the electrical potential at the pulling-up node PU is further pulled up due to a bootstrap function of the capacitor C1. The fourth switch transistor M4 is turned on and the turned on fourth switch transistor M4 supplies the signal at the first clock signal terminal CK to the touch signal outputting terminal OUTPUT. Meanwhile, since CKB=0, the fifth switch transistor M5 is turned off so that the touching signal outputting terminal OUTPUT outputs a signal of a high level.

During T3 stage of the touching stage, INPUT=0, RESET=1, CK=0, CKB=1, CHANGE=0 and VREF1=0. The first switch transistor M1 and the second switch transistor M2 are turned off. Since RESET=1, the second switch transistor M2 is turned on to pull down the electrical potential at the pulling-up node PU, and the fourth switch transistor M4 is turned off. Since CKB=1, the fifth switch transistor M5 is turned on and the turned-on fifth switch transistor M5 supplies the signal at the first reference signal terminal VREF1 to the touch signal outputting terminal OUTPUT so that the touching signal outputting terminal OUTPUT outputs a signal of a low level.

During the displaying stage, INPUT=VCOM, RESET=VCOM, CK=VCOM, CKB=VCOM, CHANGE=1 and VREF1=VCOM. The first switch transistor M1, the second switch transistor M2, the third switch transistor M3 and the fifth switch transistors M5 are turned on. The turned on first switch transistor M1 and the turned on second switch transistor M2 pull up the electrical potential at the pulling-up node PU, so that the fourth switch transistor M4 is turned on. The turned-on fourth switch transistor M4 supplies the common electrode signal at the first clock signal terminal CK to the touch signal outputting terminal OUTPUT, the turned-on third switch transistor M3 supplies the common electrode signal at the common electrode signal terminal VCOM to the touch signal outputting terminal OUTPUT, and the turned-on fifth switch transistor M5 supplies the common electrode signal at the first reference signal terminal VREF1 to the touch signal outputting terminal OUTPUT, so that the touch signal outputting terminal OUTPUT outputs the common electrode signal.

In the touch display circuit according to the embodiment of the present disclosure, the touch stage may be carried out firstly and then the displaying stage, vice versa, which is not limited.

On the basis of the same inventive idea, an embodiment of the present disclosure further provides a driving method for any of the touch display circuit as method above. The driving method may comprise: during a touching stage: in the first period, the touch triggering module is configured to supply a signal of the trigger signal terminal to the pulling-up node under control of the trigger signal terminal; in the second period, the first outputting module is configured to supply a signal of the first clock signal terminal to the touch signal outputting terminal under control of the pulling-up node; in the third period, the resetting module is configured to supply a signal of the first reference signal terminal to the pulling-up node under control of the resetting signal terminal and the second outputting module is configured to supply a signal of the second reference signal terminal to the touch signal outputting terminal under control of the second clock signal terminal; and during a displaying stage, the display switching module is configured to supply a signal of the common electrode signal terminal to the touch signal outputting terminal under control of the switch controlling terminal.

During the displaying stage, since the first clock signal terminal and the second clock signal terminal both output a common electrode signal and the first reference signal terminal and the second reference signal terminal both output a common electrode signal, the first outputting module supplies the signal at the first clock signal terminal to the ouch signal outputting terminal under control of the pulling-up node, and the second outputting module supplies the signal at the second reference signal terminal to the touch signal outputting terminal under control of the second clock signal terminal. Thus, the touch signal outputting terminal OUTPUT outputs the common electrode signal.

In the driving method according to the embodiment of the present disclosure, the order of the touching stage and the displaying stage is not particularly limited. The touch stage may be carried out firstly and then the displaying stage, vice versa, which is not limited.

Figure 5:
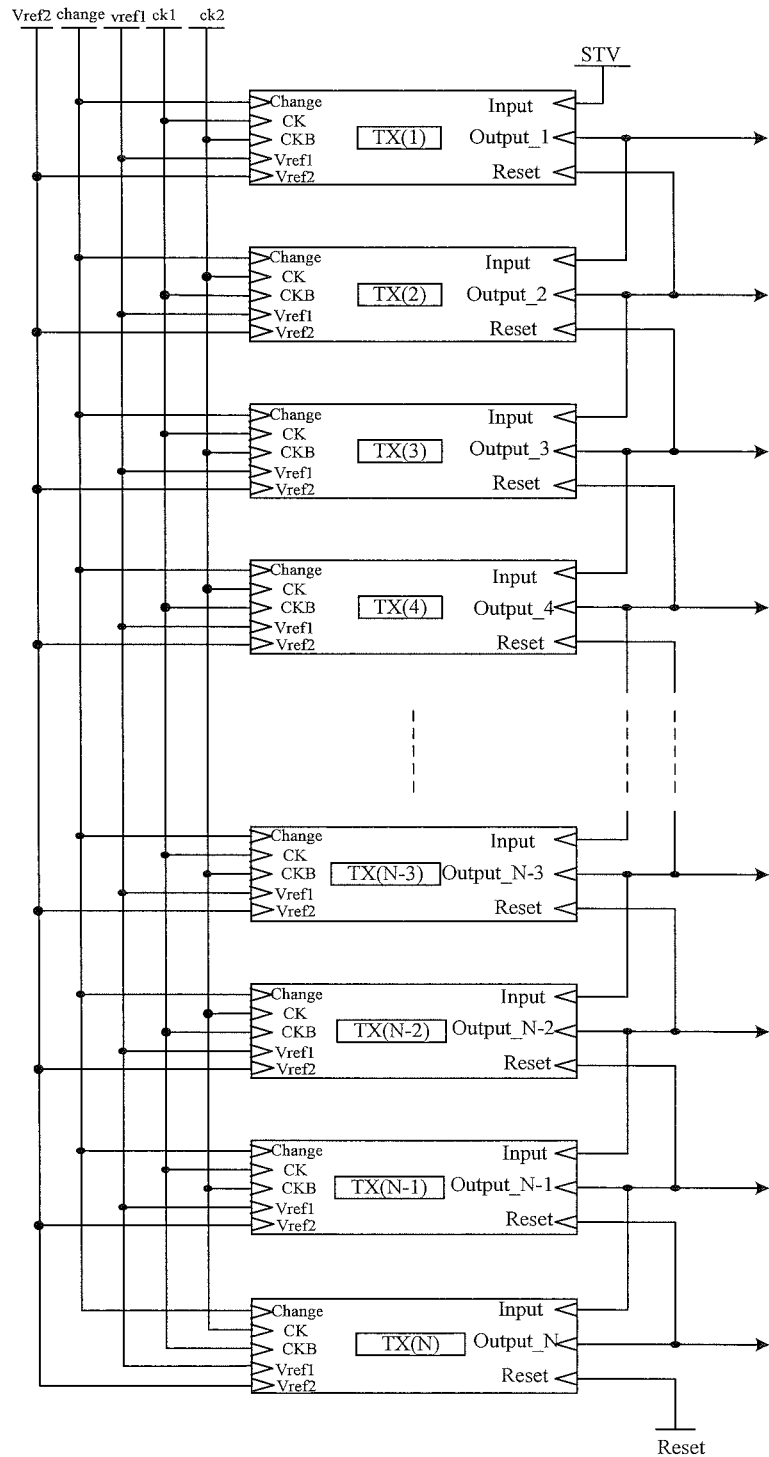
FIG. 5 is a schematic view of a partial of the structure of the touch display panel according to an embodiment of the present disclosure.

On the basis of the same inventive idea, an embodiment of the present disclosure further provides a touch display panel as shown in FIG. 5, which comprises a plurality of stages of cascaded touch display circuits (TX(1), TX(2) . . . TX(n) . . . TX(N−1), TX(N, totally N touch display circuits, in which 1≤n≤N) according to the embodiments of the present disclosure as mentioned above, wherein except for the touch display circuit in the last stage TX(N), the touch signal outputting terminals OUTPUT_n of each of the touch display circuit TX(n) of the remaining stages are connected to the trigger signal terminal INPUT of the touch display circuit in the subsequent adjacent stage TX(n+1); except for the touch display circuit in the first stage TX(1), the touch signal outputting terminals OUTPUT_n of each of the touch display circuit TX(n) of the remaining stages are connected to the resetting signal terminal RESET of the touch display circuit in the previous adjacent stage TX(n−1); and the trigger signal terminal INPUT of the touch displaying circuit in the first stage TX(1) is connected to a frame start signal terminal STV.

Particularly, the particular structure of each of the touch display circuit as mentioned above are identical to each other in functions and configurations, and here are omitted for brevity.

Furthermore, in the touch display panel according to the embodiment of the present disclosure, as shown in FIG. 5, the first clock signal terminal CK of the touch display circuit TX (n) in an odd stage and the second clock signal terminal CKB of the touch display circuit TX(n) in an even stage are connected to the same clock signal outputting terminal ck1, and the second clock signal terminal of the touch display circuit TX(n) in the odd stage and the first clock signal terminal CK of the touch display circuit TX(n) in the even stage are connected to the same clock signal outputting terminal ck2. Thus, in the touch display panel according to the embodiment of the present disclosure, it only needs two clock signals to implement the touching function and the displaying function of the touch display panel so as to facilitate a design of the touch display panel with a narrow marginal frame. In addition, since the touch display circuit as mentioned above may integrate functions of touching and displaying into one body, so the touch chip and the display chip may be integrated into one chip to reduce product cost.

Furthermore, in the touch display panel according to the embodiment of the present disclosure, as shown in FIG. 5, the first reference signal terminals VREF1 of the touch display circuit TX(n) in the respective stages are connected to the same signal inputting terminal, the second reference signal terminals VREF2 of the touch display circuit TX(n) in the respective stages are connected to the same signal inputting terminal, and the first switch controlling terminals CHANGE of the touch display circuit TX(n) in the respective stages are connected to the same signal inputting terminal.

Furthermore, in the touch display panel according to the embodiment of the present disclosure, a touch scanning line connected to the respective touch display circuits is made of a common electrode layer. thus, during the displaying stage, the touch display circuit in the respective stages apply the common electrode signal to the respective touch scanning lines; and during the touching stage, the touch display circuits in the respective stages apply the touch scanning signal to the touch scanning lines in turn.

Figure 6:
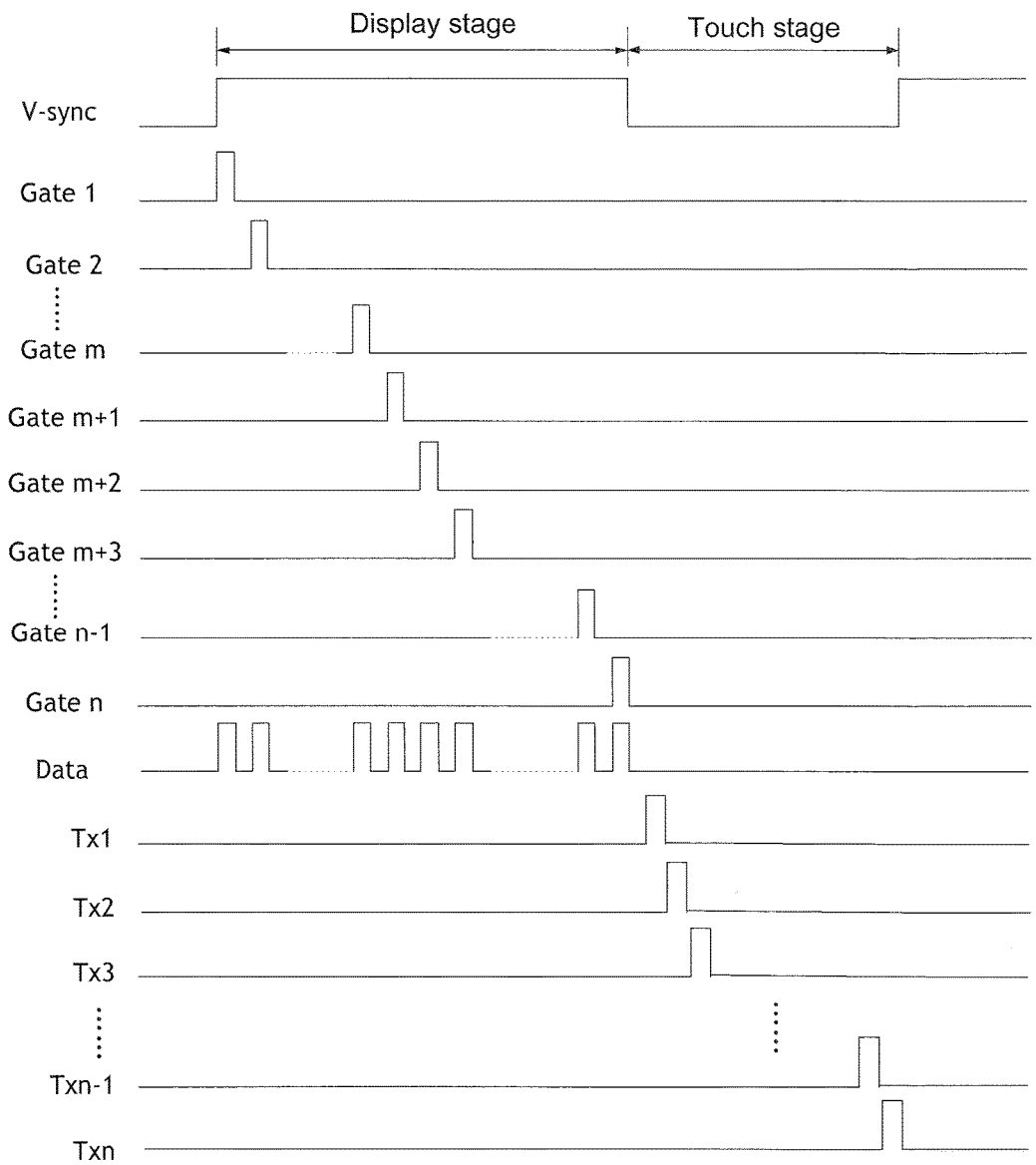
FIG. 6 is a time sequence chart of the touch display panel according to an embodiment of the present disclosure.

Particularly, e.g. in the time sequence for driving in FIG. 6, the period for the touch display panel displaying one frame (V-sync) is divided into the displaying stage (display) and the touching stage (touch). For example, if the period for the touch display panel displaying one frame is 16.7 ms, 5 ms is selected to be the touch stage and the remaining 11.7 ms is selected as the displaying stage. The periods of the two stages may be adjusted approximately according a processing capability of the integrated circuit (IC), and is not particularly limited. During the displaying stage, a gate driving circuit applies a gate scanning signal to each of the gate signal lines Gate1, Gate2 . . . Gaten, and the touch display circuit in the respective stages applies the common electrode signal to the respective touch scanning lines Tx1 . . . Txn to implement the displaying function. During the touching stage, the gate driving circuit suspends its operation, and the touch display circuits connected to the respective touch scanning lines Tx1 . . . Txn apply the touch scanning signals in turn and determine whether a touching event is happened by detecting feedback signal of the touch sensing lines which are intersected with the respective touch scanning lines, to implement the touching function.

On the basis of the same inventive idea, an embodiment of the present disclosure further provides display device comprising the touch display panels according to the embodiments of the present disclosure. The display device may be applied to any products or components having a display function, such as mobile phone, tablet computer, television, display, notebook computer, digital photo frame, navigator and the like. Since the principle of the display device is similar to that of the touch display panel, the implementation of the display device may be referred to that of the touch display panel and here is omitted for brevity.

The present disclosure provides a touch display circuit, a driving method thereof, a touch display panel and a display device. The touch display circuit comprises a touch triggering module, a display switching module, a resetting module, a first outputting module and a second outputting module. During a touching stage, the touch triggering module is configured to supply a signal of the trigger signal terminal to the pulling-up node, the first outputting module is configured to supply a signal of the first clock signal terminal to the touch signal outputting terminal, the resetting module is configured to supply a signal of the first reference signal terminal to the pulling-up node and the second outputting module is configured to supply a signal of the second reference signal terminal to the touch signal outputting terminal, so as to implement a touching function. During a displaying stage, the display switching module is configured to supply a signal of the common electrode signal terminal to the touch signal outputting terminal so as to implement a displaying function. The touch display circuit implements a time division output of the touch signal and the common electrode signal at the touch signal outputting terminal by cooperation of the respective module and implements a touch display circuit with a simple configuration so as to facilitate a design of the touch display panel with a narrow frame. Furthermore, as compared with a touch circuit of the prior art which needs to separately provide a touch chip, the touch display circuit as mentioned above may integrate functions of touching and displaying into one body, so the touch chip and the display chip may be integrated into one chip to reduce product cost.

The above description is only a preferable embodiment of the present disclosure and is not utilized to limit the present invention. Any changes, replacements and modifications within the scope and spirit of the present invention are included in the scope of the present invention.

I claim:

1. A touch display circuit, comprising a touch triggering module, a display switching module, a resetting module, a first outputting module and a second outputting module, wherein an input terminal and a control terminal of the touch triggering module are connected to a trigger signal terminal, an output terminal of the touch triggering module is connected to a pulling-up node; the touch triggering module is configured to supply a signal of the trigger signal terminal to the pulling-up node under control of the trigger signal terminal;

a control terminal of the display switching module is connected to a switch controlling terminal, an input terminal of the display switching module is connected to a common electrode signal terminal, and output terminal of the display switching module is connected to a touch signal outputting terminal; the display switching module is configured to supply a signal of the common electrode signal terminal to the touch signal outputting terminal under control of the switch controlling terminal;

a control terminal of the resetting module is connected to a resetting signal terminal, an input terminal of the resetting module is connected to a first reference signal terminal, an output terminal of the resetting module is connected to the pulling-up node; the resetting module is configured to supply a signal of the first reference signal terminal to the pulling-up node under control of the resetting signal terminal;

a control terminal of the first outputting module is connected to the pulling-up node, an input terminal of the first outputting module is connected to a first clock signal terminal, and an output terminal of the first outputting module is connected to the touch signal outputting terminal, the first outputting module is configured to supply a signal of the first clock signal terminal to the touch signal outputting terminal under control of the pulling-up node;

a control terminal of the second outputting module is connected to a second clock signal terminal, an input terminal of the second outputting module is connected to a second reference signal terminal, and an output terminal of the second outputting module is connected to the touch signal outputting terminal; the second outputting module is configured to supply a signal of the second reference signal terminal to the touch signal outputting terminal under control of the second clock signal terminal;

during a touch stage, a phase of the signal of the first clock signal terminal is opposite to that of the signal of the second clock signal terminal.

2. The touch display circuit according to claim 1, wherein the touch triggering module particularly comprises a first switch transistor in which a gate and a source of the first switch transistor are connected to the trigger signal terminal, and a drain of the first switch transistor is connected to the pulling-up node.

3. The touch display circuit according to claim 1, wherein the resetting module particularly comprises a second switch transistor in which a gate of the second switch transistor is connected to the resetting signal terminal, a source of the second switch transistor is connected to the first reference signal terminal, and a drain of the second switch transistor is connected to the pulling-up node.

4. The touch display circuit according to claim 1, wherein the display switching module particularly comprises a third switch transistor in which a gate of the third switch transistor is connected to the switch controlling terminal, a source of the third switch transistor is connected to the common electrode signal terminal, a drain of the third switch transistor is connected to the touch signal outputting signal terminal.

5. The touch display circuit according to claim 1, wherein the first outputting module particularly comprises a fourth switch transistor and a capacitor, in which a gate of the fourth switch transistor is connected to the pulling-up node, a source of the fourth switch transistor is connected to the first clock signal terminal, and a drain of the fourth switch transistor is connected to the touch signal outputting terminal; and the capacitor is connected between the gate and drain of the fourth switch transistor.

6. The touch display circuit according to claim 1, wherein the second outputting module particularly comprises a fifth switch transistor, in which a gate of the fifth switch transistor is connected to the second clock signal terminal, a source of the fifth switch transistor is connected to the second reference signal terminal, and a drain of the fifth switch transistor is connected to the touch signal outputting terminal.

7. The touch display circuit according to claim 1, wherein during a displaying stage, the first clock signal terminal and the second clock signal terminal both output a common electrode signal; and the first reference signal terminal and the second reference signal both output a common electrode signal.

8. The touch display circuit according to claim 1, wherein the switch transistors are all N-type transistors.

9. A touch display panel, comprising a plurality of stages of cascaded touch display circuits according to claim 1, wherein except for the touch display circuit in the last stage, the touch signal outputting terminals of each of the remaining stages are connected to the trigger signal terminal of the touch display circuit in the subsequent adjacent stage;

except for the touch display circuit in the first stage, the touch signal outputting terminals of each of the remaining stages are connected to the resetting signal terminal of the touch display circuit in the previous adjacent stage;

the trigger signal terminal of the touch displaying circuit in the first stage is connected to a frame start signal terminal.

10. The touch display panel according to claim 9, wherein the first clock signal terminal of the touch display circuit in an odd stage and the second clock signal terminal of the touch display circuit in an even stage are connected to the same clock signal outputting terminal, and the second clock signal terminal of the touch display circuit in the odd stage and the first clock signal terminal of the touch display circuit in the even stage are connected to the same clock signal outputting terminal.

11. A display device, comprising the touch display panel according to claim 9.

12. A driving method for the touch display circuit according to claim 1, comprising:

during a touching stage: in the first period, the touch triggering module is configured to supply a signal of the trigger signal terminal to the pulling-up node under control of the trigger signal terminal; in the second period, the first outputting module is configured to supply a signal of the first clock signal terminal to the touch signal outputting terminal under control of the pulling-up node; in the third period, the resetting module is configured to supply a signal of the first reference signal terminal to the pulling-up node under control of the resetting signal terminal and the second outputting module is configured to supply a signal of the second reference signal terminal to the touch signal outputting terminal under control of the second clock signal terminal;

during a displaying stage, the display switching module is configured to supply a signal of the common electrode signal terminal to the touch signal outputting terminal under control of the switch controlling terminal.

13. The driving method according to claim 12, wherein during the displaying stage, the first clock signal terminal and the second clock signal terminal both output a common electrode signal, and the first reference signal terminal and the second reference signal both output the common electrode signal, the first outputting module is configured to supply a signal of the first clock signal terminal to the touch signal outputting terminal under control of the pulling-up node and the second outputting module is configured to supply a signal of the second reference signal terminal to the touch signal outputting terminal under control of the second clock signal terminal.

14. A display device, comprising the touch display panel according to claim 9.

* * * * *